United States Patent [19]

Charlton

[11] 4,326,012
[45] Apr. 20, 1982

[54] SOLAR POWER BUILDING BLOCK

[76] Inventor: Walter T. Charlton, 2011 "I" St. N.W., Ste. 303, Washington, D.C. 20006

[21] Appl. No.: 188,567

[22] Filed: Sep. 18, 1980

[51] Int. Cl.³ .......................... H01L 31/04; F24J 3/02
[52] U.S. Cl. .......................................... 429/9; 52/306; 126/439; 126/450; 136/246; 136/248; 136/259; 350/258; 350/259
[58] Field of Search ............... 136/246, 259, 291, 248; 429/9; 52/306; 350/258-262; 126/439, 450; 320/2

[56] References Cited

U.S. PATENT DOCUMENTS

| | | | |
|---|---|---|---|
| 2,844,998 | 7/1958 | Vincent | 350/260 |
| 2,975,853 | 3/1961 | Friend | 181/285 |
| 3,427,200 | 2/1969 | Lapin et al. | 136/246 |
| 3,769,091 | 10/1973 | Leinkram et al. | 136/246 |
| 3,985,116 | 10/1976 | Kapany | 126/439 |
| 4,009,051 | 2/1977 | Kazis et al. | 320/15 |
| 4,040,867 | 8/1977 | Forestieri et al. | 136/244 |
| 4,053,210 | 10/1977 | Michaelis | 350/262 |
| 4,080,221 | 3/1978 | Manelas | 136/248 |
| 4,122,396 | 10/1978 | Grazier et al. | 325/492 |
| 4,143,233 | 3/1979 | Kapany et al. | 136/259 |
| 4,253,880 | 3/1981 | Bellugue | 136/259 |

OTHER PUBLICATIONS

*Chemistry And Industry*, pp. 675-676 (Aug. 1975).

Primary Examiner—Aaron Weisstuch
Attorney, Agent, or Firm—Blair, Brown & Kreten

[57] ABSTRACT

A building unit for exterior walls and the like comprising a molded block of glass having a recess in the side face which is to face the exterior, the recess having a side wall and an open outer end on which a fresnel lens is disposed, the inner end of the recess having a solar cell disposed therein so that sunlight passing through the fresnel lens impinges on the solar cell for the generation of electric power together with a battery disposed within a cavity molded in the block connected by a circuit to the solar cell for storing the generated electric power for subsequent use as needed in a residence or the like. A further embodiment has attached to the interior wall a black painted duct containing vertical radiant fins. This unit contains a "window" through which the concentrated radiation is directed by the lens arrangement of the side walls and front lens to create a highly energetic radiant impingement upon the black duct heating it. Air flowing vertically in the duct is used for heating of interior air or removal of superheated interior air by using the force of the rising air for an "air cooling" effect.

11 Claims, 7 Drawing Figures

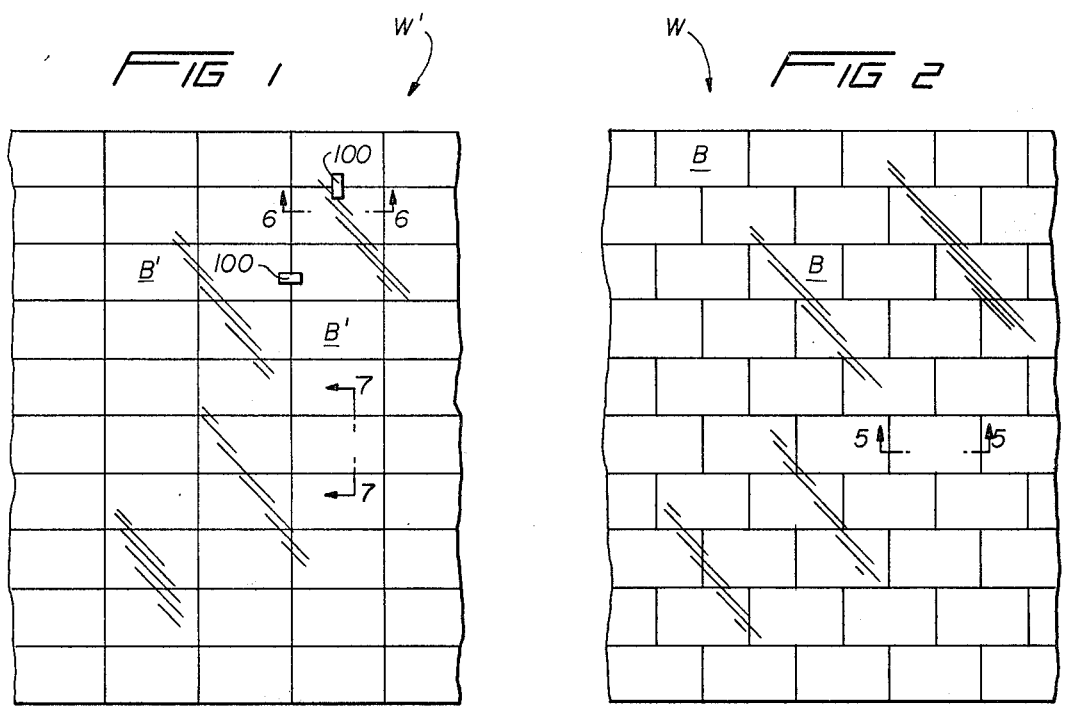
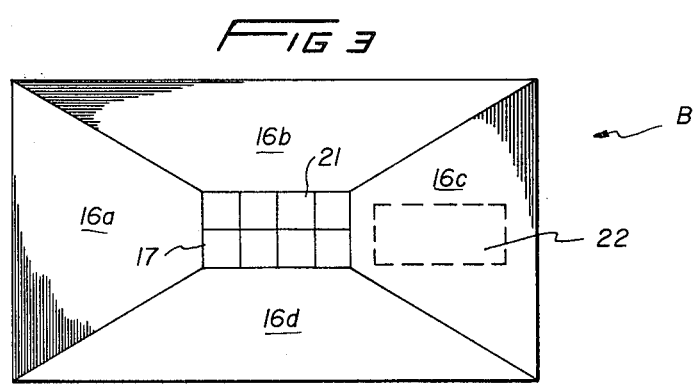
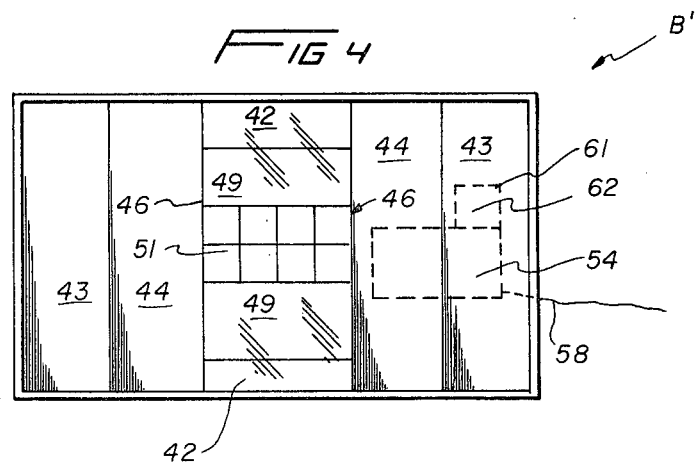

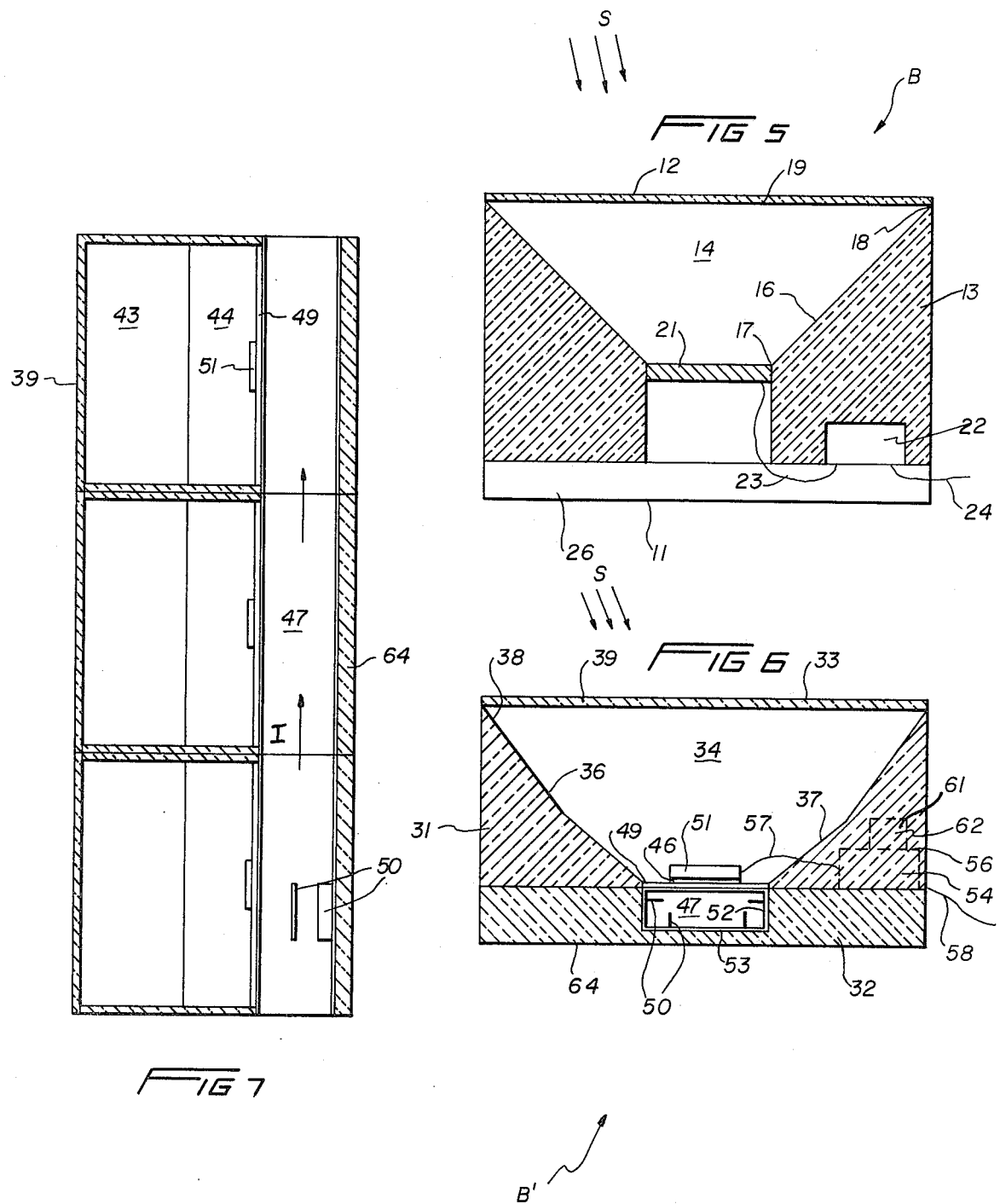

SOLAR POWER BUILDING BLOCK

BACKGROUND OF THE INVENTION

The emphasis today on energy conservation has brought about intensive efforts for new sources of energy and/or extensive research and development activities to devise techniques for reducing the amount of energy presently consumed in areas of substantial power consumption such as in residences and the like. The ready availability of solar power has long been recognized and many devices have been developed having a multitude of forms which utilize solar power for both power generation and the reduction of power consumption such as by the use of solar panels in the roof tops of residences to heat water for domestic use. The cost factor in such solar power units has always been a consideration such that research and development activities have been directed in part to a reduction in component parts by means of which solar power is utilized. One of the more popular forms of solar power components is the electrical photvoltaic cell, generally referred to as a "solar cell", which converts light such as sunlight impinging thereon into electric power. The continuous reduction in cost for such solar cells has stimulated their use so that wide spread applications for such solar cells have followed. While the initial cost of such solar cells is now reaching the practical level, associated components including installation costs for such cells add considerably to a solar power installation so that considerable consumer resistance is still being encountered. Furthermore, for solar heating units utilized on residences and the like the common application is to heat water utilized domestically and the utilization of the power developed by such solar cells for electric power per se has been more or less overlooked.

The following patents reflect the state of the art insofar as applicant is aware as it relates to the instant application:

U.S. Pat. No. 2,844,998 Vincent;
U.S. Pat. No. 2,975,853 Friend;
U.S. Pat. No. 3,229,682 Perlmutter et al;
U.S. Pat. No. 3,427,200 Lapin et al;
U.S. Pat. No. 3,769,091 Leinkram et al;
U.S. Pat. No. 3,985,116 Kapany;
U.S. Pat. No. 4,040,867 Forestieri et al;
U.S. Pat. No. 4,053,210 Michaelis;
U.S. Pat. No. 4,080,221 Manelas;
U.S. Pat. No. 4,143,233 Kapany et al.

In addition, pages 675 and 676 from an Aug. 16, 1975 *Chemistry and Industry* magazine were cited during the search.

Forestieri et al. (U.S. Pat. No. 4,040,867) describes solar cell shingles which are designed for use on house roofs.

Leinkram et al. (U.S. Pat. No. 3,769,091) contains a similar teaching, but for a satellite.

Manelas (U.S. Pat. No. 4,080,221) describes a solar cell electric and heating system which has storage batteries for storing energy in excess of that which is used. The system depicted in FIG. 7 of this patent also calls for a backup generator 81 to cut in when there is insufficient power in the battery.

Perlmutter et al. (U.S. Pat. No. 3,229,682), Lapin et al. (U.S. Pat. No. 3,427,200) and Kapany (U.S. Pat. No. 3,985,116) disclose block-type solar cells having concentrators therein for concentrating solar energy onto the actual solar cells.

The remaining patents disclose transparent and translucent building blocks for building houses and buildings.

The magazine excerpt shows a solar cell array which is coupled to a power line.

The Forestieri (U.S. Pat. No. 4,040,867) patent discloses the broad concept of incorporating solar cells in shingles.

None of the references teach the broad concept of incorporating a solar cell into a structural building block. Further, none teach that which the instant application claims as invention.

OBJECTS AND SUMMARY OF THE INVENTION

Accordingly, a primary object of this invention is to provide a new and novel building block for exterior walls or the like wherein solar power is utilized to develope electric power useful in the structure.

Another object of this invention is to provide a new and novel building block suitable for use in wall construction such as in buildings, residences and the like which provides a source of electricity for use within the structures such as lighting, appliances and the like.

A still further object of this invention is to provide a new and novel building block for an exterior wall in a residence or the like wherein sunlight is used to produce electric power for use within the structure or for heating air to be utilized in heating the structure interior.

Still another object of this invention is to provide a new and novel building block for structures such as residences or the like wherein the solar unit is incorporated within the block and wherein electric power generated by the solar unit may be stored for subsequent use or conducted back to the electric utility to reduce the electric power cost for such residences.

A still further object of this invention is to provide a new and novel building block for exterior wall construction such as walls utilized in residences or the like which is simple and inexpensive in construction, capable of prolonged use without deterioration due to ambient weather conditions etc., and which is highly efficient in operation for both power generation and air heating.

The objects of the invention and other related objects are accomplished by the provision of a body of rectangular cross-sectional shape which may be used in combination with similar bodies for the building of an exterior wall. The body includes inner and outer side faces with the outer side face having a recess provided with a side wall and an inner end in which a solar cell is disposed so that sunlight is permitted to enter the recess outer end opening for impingement on the solar cell. An electric power storage means is disposed within a cavity formed within the body by molding or the like and circuit means are provided for connecting the solar cell to the electric power storage means whereby the electric power generated by the solar cell due to impingement of sunlight on the solar cell is stored.

Further objects and benefits will become evident when considering the following detailed specification when taken in conjunction with the appended drawing figures.

BRIEF DESCRIPTION OF THE DRAWINGS

FIG. 1 is an elevation view of an exterior wall incorporating the building blocks of the invention;

FIG. 2 is a view similar to FIG. 1 of an exterior wall showing another arrangement of the building blocks of the invention;

FIG. 3 is a front view of one embodiment of the building block of the invention;

FIG. 4 is a front view of another embodiment of the building block of the invention;

FIG. 5 is a sectional view taken substantially along lines 5—5 of FIG. 2 in the direction of the arrows;

FIG. 6 is a sectional view taken substantially along lines 6—6 of FIG. 1 in the direction of the arrows; and FIG. 7 is a sectional view taken substantially along lines 7—7 of FIG. 1.

DESCRIPTION OF THE PREFERRED EMBODIMENT

Referring now to the drawings and to FIG. 1 in particular, there is shown a plurality of building blocks constructed in accordance with the invention which are designated generally by the letter B'. As shown in FIG. 2, the building blocks B are arranged in a plurality of tiers and in the embodiment of FIG. 2 the building blocks B in each tier are arranged in staggered relationship with the building blocks in the adjacent tier. It is contemplated that not all blocks be necessarily solar active but the active blocks can be arranged in diverse configurations: alternate tiers, alternate blocks in a given tier, etc.

Each of the building blocks B is substantially rectangular in cross section and include inner and outer side faces 11, 12 respectively, as shown best in FIG. 5. The building block B is preferably formed in a molding operation to provide a body 13 which is preferably molded of a suitable material having compressive strength, such as glass.

The outer side face 12 of the block body 13 is provided with a recess 14 having a side wall 16 tapering inwardly to an inner end 17 and having an outer end opening 18 for admitting sunlight therethrough as shown by the arrows S. Preferably, the outer end opening 18 of the recess 14 is provided with a fresnel lens 19 in closing relationship therewith for collimating the sunlight S.

The side wall 16 is preferably of frusto-conical shape having flat sections 16a, 16b, 16c and 16d as shown best in FIG. 3 and the surfaces of these sections are provided with a mirror surface by means of which the collimated sunlight passing through the fresnel lens 19 is reflected towards the inner end 17 of the recess 14. A solar cell 21 is disposed within the recess inner end 17 as shown in FIGS. 3 and 5 the solar cell 21 being of any well known construction such as a photoelectric or photovoltaic cell. As is well known, such a solar cell 21 converts sunlight impinging thereon into electric power.

The building block of the invention also includes electric power storage means disposed within the body 13 together with circuit means for connecting the solar cell 21 to the electric power storage means whereby the electric power generated by the solar cell 21 is stored. Most specifically, a cavity is provided within the building block body 13 in which a battery 22 of conventional construction is positioned, the battery being connected by a suitable conductor 23 to the solar cell 21 whereby the electric power generated by the solar cell 21 is conducted to the battery 22 for continuous charging of the battery.

Suitable means such as a conductor 24 are provided for connecting the output of the battery to a power utilization device such as a transformer and then to the wiring system in a residence or the like.

In the preferred embodiment, the inner side face 11 of the building block body 13 is provided with a layer of thermal insulation 26 whereby the heat developed by the sunlight S entering the recess 14 is retained within the block 13.

In the operation of the building block B of the invention in the embodiment of FIG. 2, the sunlight S enters the recesses 14 of the blocks B and impinges on the solar cells contained therein so that all of the batteries 22 in the building block B are maintained in a charged condition. The conductors 24, connected to each of the batteries 22, can be connected in parallel and then to a utilization circuit such as house wiring in a residence or the like of which the wall W is a part. Power from the batteries 22 thereby provide a source of power for the residence. It should be understood, that in the event power consumption is not required in the residence associated with the wall W this power may be returned again via an intervening transformer to an electric utility through the distribution and transmission lines thereby establishing a credit for the homeowner with the electric utility.

Referring now to FIG. 1, there is shown another embodiment of the invention wherein building blocks B' are arranged in a plurality of tiers to form a wall W' which also may be an exterior wall in a residence or the like. In the embodiment of FIG. 1, the building blocks B' are arranged in vertically aligned relationship to form a series of side by side stacks. It should however, be understood that some of the blocks in the wall W' of FIG. 1 may be standard building blocks if desired. In this case an interlocking pin 100 can be used to tie in the blocks.

The building block B' utilized in the wall W' is shown in FIGS. 4 and 6 and includes a block body 31 also preferably formed by a molded process utilizing a suitable material such as glass. The block body 31 includes an inner side face 32 and an outer side face 33 with a recess 34 having a side wall 36. The recess 34 is provided with an inner end 37 and an outer end opening 38 over which a fresnel lens 39 is disposed for collimating the sunlight S as referred to above with the respect to the embodiment of FIG. 5. The recess side wall 36 includes substantially flat sections 49, 42 and sections 43, 44 of compound angular shape, the side wall sections 43, 44 being preferably mirrored so as to reflect the collimated sunlight within the recess 34 towards the inner end 37 of the recess, as shown best in FIG. 4.

The recess inner end 37 includes a channel-shaped vertically extending cooling slot 46 extending throughout the height of the block body 31 for the passage of air therethrough. A panel 49 of transparent material such as glass extends throughout the major portion of the slot 46 as shown best in FIG. 4 and a solar cell 51 is mounted thereon but spaced from the plate so that the sunlight S reflected towards the recess inner end 37 both impinges on the solar cell 51 and passes through the portion of the glass panel 49 above and below the solar cell 51. Thus, electric power is generated in the solar cell 51 by the impingement of sunlight thereon and the sunlight passing through the exposed portions of the glass panel 49 into the duct 47 transfers heat by radiation to the air flowing therein. Preferably, the surface of the duct 47 is coated with a dark color of the absorption of heat along the sides 52 and rear portions 53 of the duct 47. Fins 50 provide and enhance heat exchange within duct 47.

The block body 31 is also provided with electric power storage means such as a battery 54 disposed within a cavity 56 within the block body 31 and means such as a conductor 57 is utilized to connect the output of the solar cell 51 to the input of the battery 54 as in the embodiment of FIG. 5. Also, the output of the battery 54 is connected by means of conductors 58 to an associated power utilization device. The building block B' is also preferably provided with a further cavity 61 in which a micro processor chip 62 or the like is disposed for controlling the power input to the battery 54 and the output of the battery 54 to the power utilization device. Also, the inner side face 32 of the building block 31 is provided with a layer of insulation 64 as in the embodiment of FIG. 5.

In the operation of the building block B' of FIG. 6, blocks B' are arranged in the vertical stacked relationship as described with reference to the wall W' of FIG. 1 so that in the stack of blocks B' the ducts 47 are positioned in communication whereby the air entering in the direction of arrow I in the lowermost block B' in FIG. 2 is heated as it flows upwardly through the blocks B' for subsequent discharge from the end of the duct in the uppermost block B' for subsequent utilization in a residence or the like for heating purposes. It should be understood that any suitable arrangement may be provided for conducting air from the interior of the residence to the bottom of the stack of blocks B' and together with a return conduit for directing the heated air from the stack of blocks B' back to the interior of the residence.

FIG. 7 shows such an arrangement wherein plural blocks B' are placed in vertical registry so that overlying blocks and their respective ducts 47 communicate and assist in the air flow. Although the embodiment of FIG. 2, 3 and 5 are suggested for a staggered wall relationship, a transparent panel and associated duct work can similarly be provided with the ducts 47 in offset registry relative to a centerline in FIG. 6 for example so that air may be transferred as well. Moreover, although walls were shown in the preferred embodiment, the instant application also considers the provision of these blocks as paving stones for its associated purposes.

Having thus described the invention, it should be apparent that numerous structural modifications are contemplated as being a part of this invention as set forth hereinabove and defined hereinbelow by the claims.

What is claimed is:

1. A device for forming static structures such as walls or the like exposed to sunlight comprising, in combination,
    a building block having a molded body of rectangular cross-sectional shape and compressive strength for use as a building unit having opposed inner and outer side faces, said body outer side faces having a recess therin, said recess having side walls and an inner end,
    a solar cell disposed in said body within the inner end of said recess, said recess having an outer end opening into said body outer side face for exposure to sunlight in a wall construction,
    electric power storage means disposed within said body and circuit means for connecting said solar cell to said electric power storage means whereby the electric power generated by said solar cell upon the impingement of sunlight on said solar cell passing through the outer end opening of said recess is stored in said storage means, and
    means for connecting said electric power storage means to an associated power utilization device.

2. A building block for structures such as walls or the like exposed to sunlight comprising, in combination,
    a body of rectangular cross-sectional shape for use as a building unit having opposed inner and outer side faces, said body outer side face having a recess therein, said recess having side walls and an inner end,
    a solar cell disposed in said body within the inner end of said recess, said recess having an outer end opening into said body outer side face for exposure to sunlight in a wall construction,
    electric power storage means disposed within said body and circuit means for connecting said solar cell to said electric power storage means whereby the electric power generated by said solar cell upon the impingement of sunlight on said solar cell passing through the outer end opening of said recess is stored in said storage means,
    means for connecting said electric power storage means to an associated power utilization device, and a layer of thermal insulation on said body inner side face.

3. A building block in accordance with claims 1 or 2 wherein the side wall of said recess is tapered inwardly for directing the sunlight onto said solar cell.

4. A building block in accordance with claim 3 wherein said recess side wall is provided with a mirror surface.

5. A building block in accordance with claim 4 including a fresnel lens disposed within said outer end opening of said recess for collimating the sunlight passing through said recess end opening.

6. A building block in accordance with claim 5 wherein said electric power storage means comprises a battery and a cavity within said body for accommodating said battery.

7. A building block in accordance with claim 1 including a layer of thermal insulation on said body inner side face.

8. A building block in accordance with claim 1 including a vertically extending duct in said body adjacent said inner side face on the opposite side of said solar cell from said body outer side face, said duct being adapted for the flow of air therein and whrein said recess inner end is provided with an opening for the passage of sunlight therethrough into said duct for transfer heating said air flowing within said duct.

9. A building block in accordance with claim 8 wherein said solar cell is disposed within said recess inner end opening whereby a portion of the sunlight impinges on said solar cell and a portion of the sunlight is directed around said solar cell into said duct, said duct being blackened and having fins thereon for efficient heat transfer.

10. A building block in accordance with claim 9 including a glass panel mounted in said recess inner end opening through which sunlight is permitted to pass and wherein said solar cell is mounted on said glass panel.

11. A building block in accordance with claim 10 wherein said body is of molded construction and is formed of glass for structural strength.

* * * * *